United States Patent [19]
Kata et al.

[11] Patent Number: 5,757,068
[45] Date of Patent: May 26, 1998

[54] CARRIER FILM WITH PERIPHERAL SLITS

[75] Inventors: Keiichiro Kata; Shuichi Matsuda, both of Tokyo, Japan

[73] Assignee: NEC Corporation, Tokyo, Japan

[21] Appl. No.: 533,208

[22] Filed: Sep. 25, 1995

[30] Foreign Application Priority Data

Sep. 30, 1994 [JP] Japan ................... 6-237425

[51] Int. Cl.$^6$ ................ H01L 23/48; H05K 7/20
[52] U.S. Cl. ............... 257/668; 257/673; 257/676; 257/698; 257/687
[58] Field of Search ................ 757/448, 700, 757/687, 672, 676, 697, 698, 673

[56] References Cited

U.S. PATENT DOCUMENTS

| | | | |
|---|---|---|---|
| 5,028,986 | 7/1991 | Sugano et al. | 257/698 |
| 5,161,009 | 11/1992 | Tandi et al. | 257/668 |
| 5,220,486 | 6/1993 | Takubo et al. | 257/701 |
| 5,223,741 | 6/1993 | Bechtel et al. | 257/701 |
| 5,586,666 | 12/1996 | Imamura | 257/786 |

FOREIGN PATENT DOCUMENTS

| | | |
|---|---|---|
| 49-52973 | 5/1974 | Japan . |
| 63237425 | 10/1988 | Japan . |
| 4216660 | 8/1992 | Japan . |
| 04365343 | 12/1992 | Japan . |
| 5129366 | 5/1993 | Japan . |
| 677293 | 3/1994 | Japan . |

OTHER PUBLICATIONS

European Search Report, dated Apr. 24, 1997.

*Primary Examiner*—Tom Thomas
*Assistant Examiner*—Alexander Oscar Williams
*Attorney, Agent, or Firm*—Whitham, Curtis & Whitham

[57] ABSTRACT

There is provided a carrier film (130, 140) having a plurality of slits (135) formed by the periphery of a chip mounting region (138) on which a semiconductor chip 10 is to be mounted. The chip mounting region is rectangular and four slits are formed along the four sides of the chip mounting region. The slits may be formed by means of punching with a die or etching.

3 Claims, 7 Drawing Sheets

CARRIER FILM WITH PERIPHERAL SLITS

BACKGROUND OF THE INVENTION

The present invention relates to a carrier film and, more particularly, to a carrier film suitable for a semiconductor device which can advantageously be mounted on, for example, a circuit board at a high density.

Semiconductor devices of various forms have been developed to meet recent demands in the electronics field towards size and weight reduction, speed increase, and improvement of functional operations of the devices. The semiconductor device comprises a package and a semiconductor chip (hereinafter, also referred to as a chip) contained in the package. The chip has been integrated higher and higher, and such a highly integrated semiconductor chip increases the number of terminals thereon. In addition, there have been severe demands on the semiconductor chips towards the possible reduction in size. The terminal-to-terminal pitch should thus be reduced to meet these demands or requirements for the semiconductor devices. A semiconductor device having a high terminal count can be obtained by inner lead bonding or by area array bonding. The inner lead bonding and the area array bonding are expected to be inevitable for the field of the semiconductors.

The inner lead bonding (ILB) is used to make electrical contact between the chip and the leads within the package. Various bonding technologies are available to achieve this inner lead bonding. Wire bonding is the most extensively used electrical interconnection process. In this process, fine wires are used to make electrical contact between the bonding pads on the chip and the corresponding leads on the package. The wire diameter is typically from 20 to 30 micrometers. Wire bonding techniques include thermocompression bonding, ultrasonic bonding, and thermosonic bonding.

The use of the fine wires limits the number of interconnections available in one package. The recent demands for the semiconductor devices with a high terminal count thus causes a problem of poor connections between the wire and the bonding pads. Considering this fact, the wire bonding has been replaced with wireless bonding. The wireless bonding is also called gang bonding, with which all bumps on the electrode pads are bonded simultaneously to the leads. Wireless bonding techniques include tape automated bonding (TAB) and flip-chip bonding. The TAB is also referred to as tape carrier bonding.

In the TAB technique, a laminated tape of gold-plated copper foil etched in the form of leads is bonded to the bumps on the electrode pads. The elimination of the wire bonding is advantageous from viewpoints of size reduction and highly integrated packaging of the device. On the other hand, the flip-chip bonding requires to make a raised metallic bump of solder on the chip. The chip is then inverted and bonded face down to the substrate interconnection pattern. This process lends itself to production of semiconductor devices with a high terminal count and a smaller pitch. In addition, this technique is also advantageous to provide a fast, low-noise semiconductor device with the short length of the interconnections.

The TAB and flip-chip bonding techniques use the bumps provided between the chip and the package to make electrical interconnection between them. These techniques are disclosed in, for example, Japanese Patent Laid-open Nos. 5-129366 and 6-77293.

As mentioned above, the film carrier semiconductor device disclosed in these laid-open publications uses the bumps for the electrical interconnection between the chip and the carrier film. There is another film carrier semiconductor device in which the electrical interconnection between the chip and the carrier film is achieved without using the bumps. The semiconductor chip and the carrier film are electrically connected during the assembly process. The bumps are used only for the purpose of connecting the film carrier semiconductor device with, for example, a circuit board. The film carrier semiconductor device of the type described comprises a semiconductor chip and a carrier film. Contact pads are provided on the semiconductor chip at one side thereof. The contact pads are arranged along the periphery of the semiconductor chip. Interconnecting layers are provided on the carrier film. The carrier film is also provided with through-holes and openings formed therein. The openings are formed at the position corresponding to the contact pads.

A conventional process for manufacturing a semiconductor device is described first for the purpose of facilitating the understanding of the present invention. In this event, description is made on a process for manufacturing a film carrier semiconductor device. A wafer, which comprises a plurality of chip sections each having chip electrodes formed thereon, is covered with a passivating film by using a well-known technique. After the formation of the passivating film, the chip electrodes are exposed to the atmosphere. The chip sections are then separated from each other into individual chips along scribe lines by means of a known dicing technique using a dicing saw. The semiconductor chip so obtained is prepared along with a carrier film and an adhesion film. The adhesion film is positioned relative to the semiconductor chip and placed thereon. The carrier film and the semiconductor chip are subjected to heat and pressure to adhere them through the adhesion film. The carrier film is then cut along the edges of the chip by means of any one of the known adequate methods. Next, bump electrodes (solder bumps) are formed on corresponding outer chip electrodes arranged on the carrier film.

This process, however, has a disadvantage of warp of the carrier film due to the thermal history thereof. To cut the warped carrier film may cause the contact between the carrier film and the semiconductor chip to be loaded, stripping off the film from the chip. The stripping off the chip may be a cause of poor conductivity of the chip. In addition, the deformation of the carrier film may lead to some troubles during steps between adhering the carrier film to the semiconductor chip to cutting the film into the size of the chip.

Another conventional process proposes to form a liquid resin pouring hole in the carrier film to adhere the semiconductor chip to the carrier film by using the resin poured through this hole. When the liquid resin is poured into the resin pouring hole, the surface tension of the liquid resin causes it to be left on the side surfaces of the semiconductor chip rather than to be flow along the wall. This second process thus causes the resin portion to extend outside over the chip surface, so that the resin on the sides of the chip is left there without being removed from the surface when the carrier film is cut along the edges of the chip assembly by using a mold. Therefore, the second process cannot control a range on the semiconductor device to be sealed with a resin. Accordingly, the semiconductor device thus obtained is larger in width and length than the semiconductor chip.

Regarding the problem of carrier film deformation, Japanese Patent Laid-open No. Sho 4-216660 discloses a lead frame for a semiconductor device having a die pad with four slits formed therein. The slits are formed at the boundary between the central portion of the die pad and other pads for an insulation film. These slits extend along the sides of the die pad for absorbing distortion or deformation which otherwise is caused upon depressing the die pad. The disclosure is, however, directed to absorb the distortion of the die pad and the pads for the film. No disclosure is made on avoiding warping of the carrier or insulation film.

Accordingly, an object of the present invention is to provide a carrier film which is free from warping during assembly of the semiconductor chip and the carrier film.

Another object of the present invention is to provide a carrier film with which no poor contact is caused upon cutting the carrier film after being mounted on the semiconductor chip.

Yet another object of the present invention is to provide a carrier film which can to be cut to have a size as close to the chip size as possible.

It is another object of the present invention to provide a carrier film which allows the control or adjustment of the area to be used for sealing the semiconductor chip with a liquid resin.

SUMMARY OF THE INVENTION

In order to achieve the above mentioned object, there is provided a carrier film comprising a mounting region on which a semiconductor chip is to be mounted, and a plurality of slits formed in the carrier film by the periphery of the mounting region.

The above and other objects, features and advantages of the present invention will become more apparent in the following description and the accompanying drawing in which like reference numerals refer to like parts and components.

DESCRIPTION OF THE PREFERRED EMBODIMENT

Figure 1A:
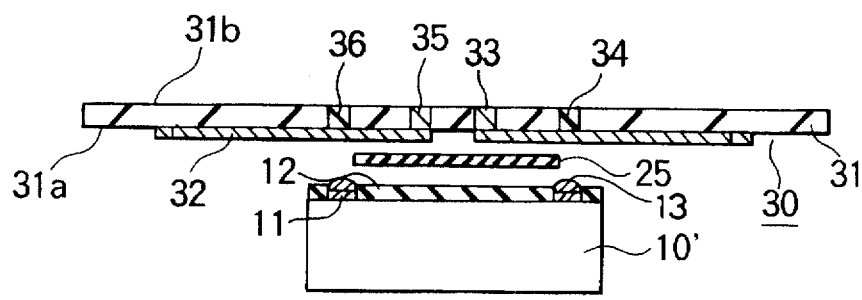
FIGS. 1A through 1G are cross-sectional flow diagrams showing a process for manufacturing a conventional semiconductor device.

A conventional process for manufacturing a semiconductor device is described first for the purpose of facilitating the understanding of the present invention. In this event, description is made on a process for manufacturing a film carrier semiconductor device. Referring to FIG. 1A, a semiconductor bare chip is prepared by using, for example, a well-known wafer manufacturing technique. A semiconductor chip 10' has electrodes (contact pads) 11 formed thereon. Although the illustrated chip electrodes 11 are formed along the periphery of the semiconductor chip 10', the chip electrodes may be formed within an active area. The chip electrodes 11 are typically made of an aluminum-based alloy. The semiconductor chip 10' is then provided with a passivating film 12. More particularly, the entire surface of the semiconductor chip 10' is covered with the passivating film 12. The passivating film 12 may be made of, for example, polyimide, silicon nitride, or silicon oxide by using a well-known technique such as spin coating. The passivating film has a thickness of 20 micrometers or smaller. After the formation of the passivating film, the chip electrodes 11 are exposed to the atmosphere by means of exposing the semiconductor chip 10' to light and etching it. As a result, the passivating film 12 covers the entire surface of the semiconductor chip 10' except for the locations where the chip electrodes 11 are formed. The semiconductor chip 10' obtained in the manner described above is prepared along with an adhesion film 25 and a carrier film 30. The adhesion film 25 is interposed between the semiconductor chip 10' and the carrier film 30. Ball bumps 13 of gold are formed on the chip electrodes 11. The adhesion film 25 is smaller than the semiconductor chip 10' and has a thickness of about several ten micrometers.

The carrier film 30 comprises an organic insulation film 31. The organic insulation film 31 may be, for example, a polyimide-based insulation film. The organic insulation film 31 has a first surface 31a and a second surface 31b. Interconnection layers 32 are provided on the organic insulation film 31 on the side of the first surface 31a. Through-holes 33 are formed in the insulation film 31. One end of each through-hole 33 faces the interconnection layer 32. Each through-hole 33 passes through the insulation film 31 to the second surface 31b thereof. The insulation film 31 is also provided with openings 34 penetrating through the film. The openings 34 are formed at the position corresponding to the chip electrodes 11. Each through-hole 33 is filled with a conductive electrode 35. Likewise, each opening 34 is filled with a filler material 36.

Figure 1B:
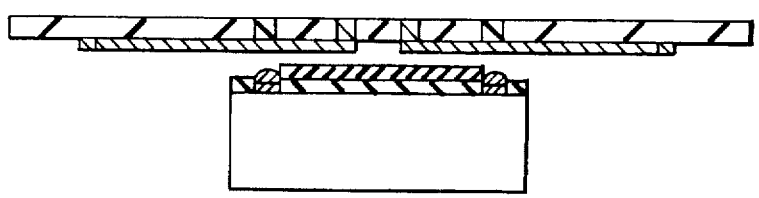

Referring to FIG. 1B, the adhesion film 25 is positioned relative to the semiconductor chip 10' and placed thereon. When made of a thermoplastic resin, the adhesion film 25 can be temporarily fixed on the semiconductor chip 10' by means of heating it from the side of the chip up to a temperature at which the adhesion film 25 begins to melt. In this event, the adhesion film 25 is adhered to the semiconductor chip 10' in such a manner that no voids are trapped between the film 25 and the chip 10'.

Figure 1C:
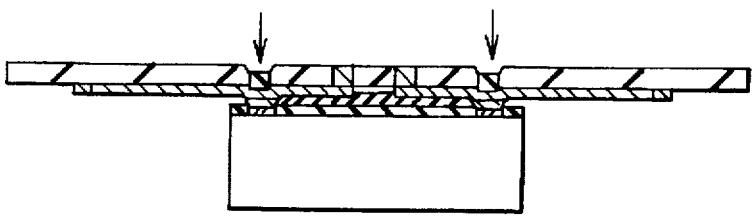

Referring to FIG. 1C, the carrier film 30 is positioned relative to the semiconductor chip 10' with the adhesion film 25 thereon, and the interconnection layers 32 are connected to the chip electrodes 11 via the ball bumps 13 by means of the inner lead bonding technique. More specifically, the conductive electrode 35 contacts with one end of the interconnection layer 32. The other end of the interconnection layer 32 reaches between the chip electrode 11 and the opening 34. In this event, the aluminum forming the chip electrode 11 is reacted with copper forming the interconnection layer 32 and with the gold forming the ball bumps 13 into an aluminum-copper-gold alloy to ensure the interconnection Referring to FIG. 1D, the combination of the semiconductor chip 10' and the carrier film 30 is subjected to heat and pressure to adhere them through the adhesion film 25. The combination, which is referred hereinafter to as a chip assembly, is heated and pressurized for several seconds from the side of either the semiconductor chip 10' or the carrier film 30.

Bump electrodes (solder bumps) 37 are formed on corresponding outer chip electrodes 11 arranged as an array on the carrier film 30 at the second surface 31b thereof. The bump electrodes 37 may be formed by using a method disclosed in, for example, Japanese Patent Laid-open No. 49-52973. The bump electrodes 37 are formed by soldering a solder wire by using the wire bonding process on the surfaces of the semiconductor device corresponding to the chip electrodes 11 on the chip. The balls are then bonded to the pads, after which the wires are cut.

Figure 1D:
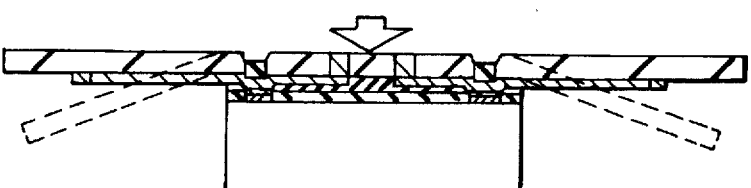

The above mentioned steps illustrated in FIGS. 1B through 1D are not the limit of on the methods available for connecting the carrier film 30 and the semiconductor chip 10'. The adhesion film 25 may be positioned and plated relative to the carrier film 30 rather than the semiconductor chip 10'. Alternatively, the inner lead bonding may be made after the carrier film 30 is adhered to the semiconductor chip 10' with high accuracy with the adhesion film 25 interposed between them.

Figure 1E:
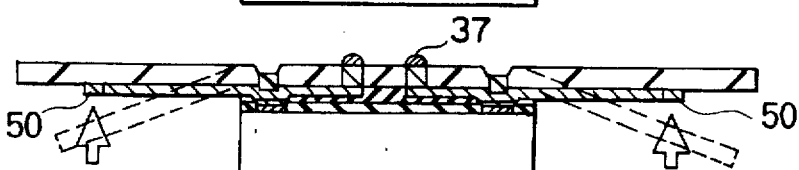

In FIG. 1E, the chip assembly is subjected to an electrical sorting operation and tests on the long-term reliability under low electric field bias temperature (BT) by using a sorting pad 50 in the same manner as in typical tape carrier packages (TCP). The outer configuration and dimensions of the carrier film 30 are designed to meet the specifications determined by Electronic Industries Association of Japan (EIAJ). Such a design allows common use of sorting tools such as sockets and balls for various semiconductor devices.

Figure 1F:
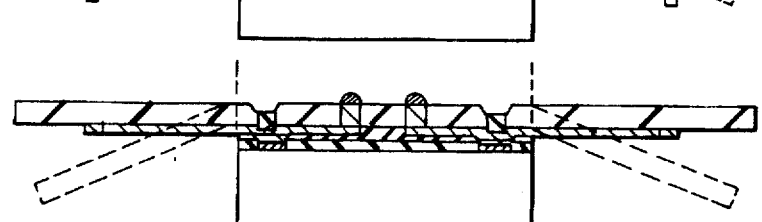
Figure 1G:
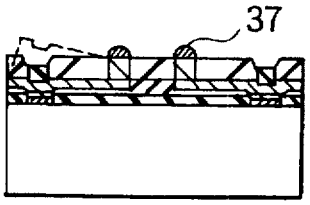

In FIG. 1F, product names are labelled on the back surface of the chip by using a laser beam. In FIG. 1G, the carrier film 30 is then cut along the edges of the chip assembly by using a mold. Typically, the cutting length and the width is larger by approximately 100 micrometers on each side than those of the chip assembly when a mold is used for cutting. More precise cutting may be achieved by using a dicing saw or a laser beam.

This process is, however, disadvantageous in that the carrier film 30 is warped due to the thermal history of the film as indicated by broken lines in FIGS. 1D through 1F. If the carrier film is cut into the size of the semiconductor chip while being warped, the contact between the carrier film and the semiconductor chip is loaded to cause removal of the film from the chip. In addition, such a load may sometimes be a cause of poor conductivity of the chip. Furthermore, a problem may arise that is associated with the deformation of the carrier film during steps of from adhering the carrier film to the semiconductor chip to cutting the film into the size of the chip.

Another conventional process for manufacturing a semiconductor device is described with reference to FIGS. 2A through 2G. How to form the adhesion layer is a difference of this second process from the above mentioned one.

Figure 2A:
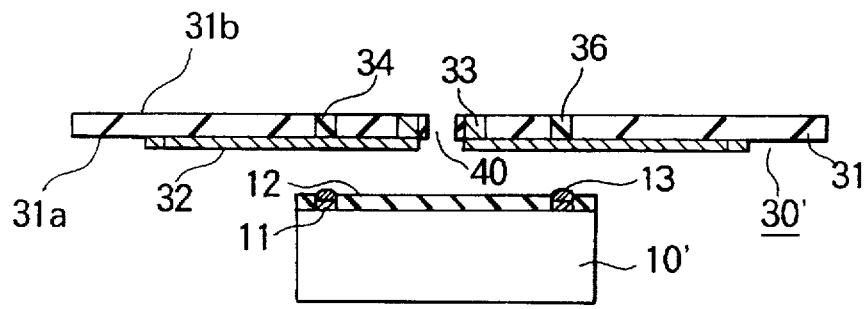
FIGS. 2A through 2G are cross-sectional flow diagrams showing another process for manufacturing a conventional semiconductor device.

As illustrated in FIG. 2A, a liquid resin pouring hole 40 is formed in a carrier film 30' on which the interconnection layer 32 is formed. The carrier film 30'is prepared in the same manner as described above except that the liquid resin pouring hole 40 is provided. Ball bumps 13 of gold are formed on the chip electrodes 11.

Figure 2B:
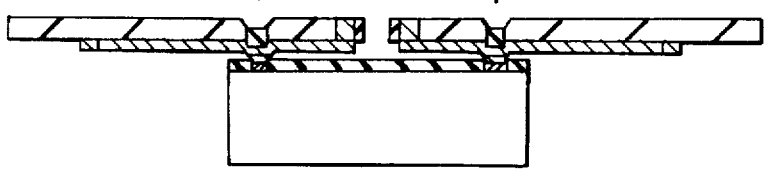
Figure 2C:
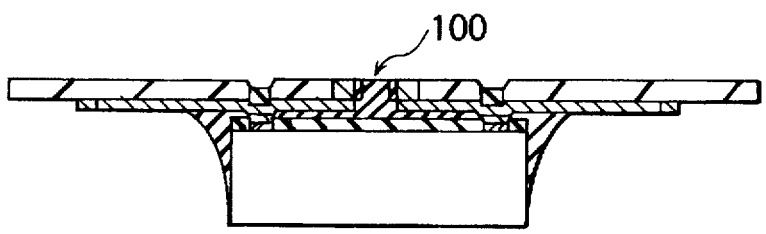

Referring to FIG. 2B, the carrier film 30' is positioned relative to the semiconductor chip 10' with the adhesion film 25 thereon, and the interconnection layers 32 are connected to the chip electrodes 11 via the ball bumps 13 by means of the inner lead bonding technique. Then, referring to FIG. 2C, a liquid resin 100 is poured into the resin pouring hole 40 for adhering the semiconductor chip 10' to the carrier film 30'. In this event, the surface tension of the liquid resin 100 causes it to be kept on the side surfaces of the semiconductor chip 10' rather than to flow along the wall. Preferably, the resin used has a moderate flowability and is capable of forming a thin film. Examples of a resin having such properties include epoxy, silicone, silicone-epoxy, and polytetrafluoroethylene (Teflon). Of these, silicone-and polytetrafluoroethylene-based resins are suitable because of their resilient and elastic properties exhibited after being cured.

Figure 2D:
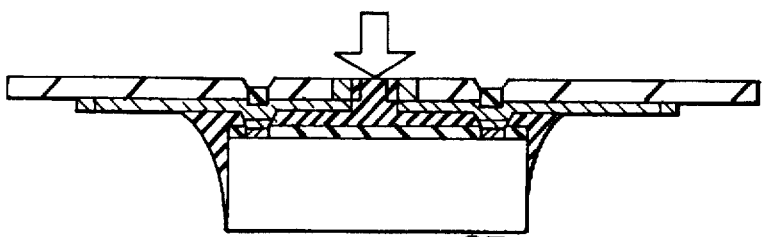

Referring to FIG. 2D, the carrier film 30' is smoothened to provide a wrinkle-free flat surface. This second process can provide only a less smooth surface with less uniform application of the resin, and inferior control of the region as compared with the above mentioned first process. This second process causes the resin portion to extend outside over the chip surface. Bump electrodes (solder bumps) 37 are formed on corresponding outer chip electrodes 11. The bump electrodes 37 are formed on the surfaces of the semiconductor device corresponding to the chip electrodes 11 on the chip.

Figure 2E:
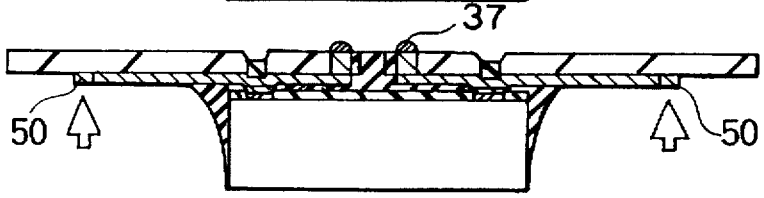
Figure 2F:
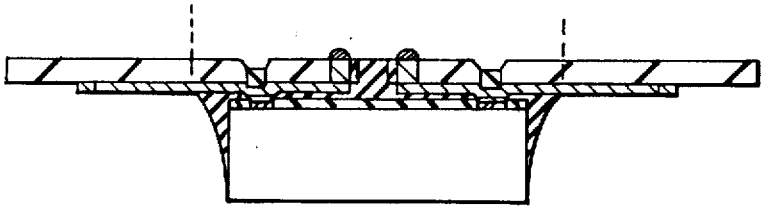
Figure 2G:
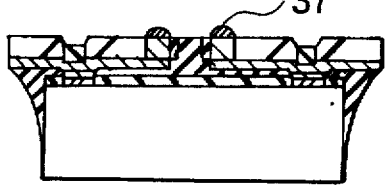

Next , as shown in FIG. 2E, the semiconductor chip assembly is subjected to an electrical sorting operation and tests on the long-term reliability under low electric field bias temperature (BT) by using a sorting pad 50 in the same manner a s in typical tape carrier packages (TCP). In FIG. 2F, product names are labelled on the back surface of the chip by using a laser beam. In FIG. 2G, the carrier film 30' is then cut along the edges of the chip assembly by u sing a mold. In this event, the resin 100 on the sides of the chip is left there without being removed from the surface.

As well as having a similar problem of film warping to the above mentioned first conventional process, this second process cannot control a range on the semiconductor device to be sealed with a resin because the liquid resin is left on the side surfaces of the chip. Accordingly, the semiconductor device thus obtained is larger in width and length than the semiconductor chip.

Figure 3A:
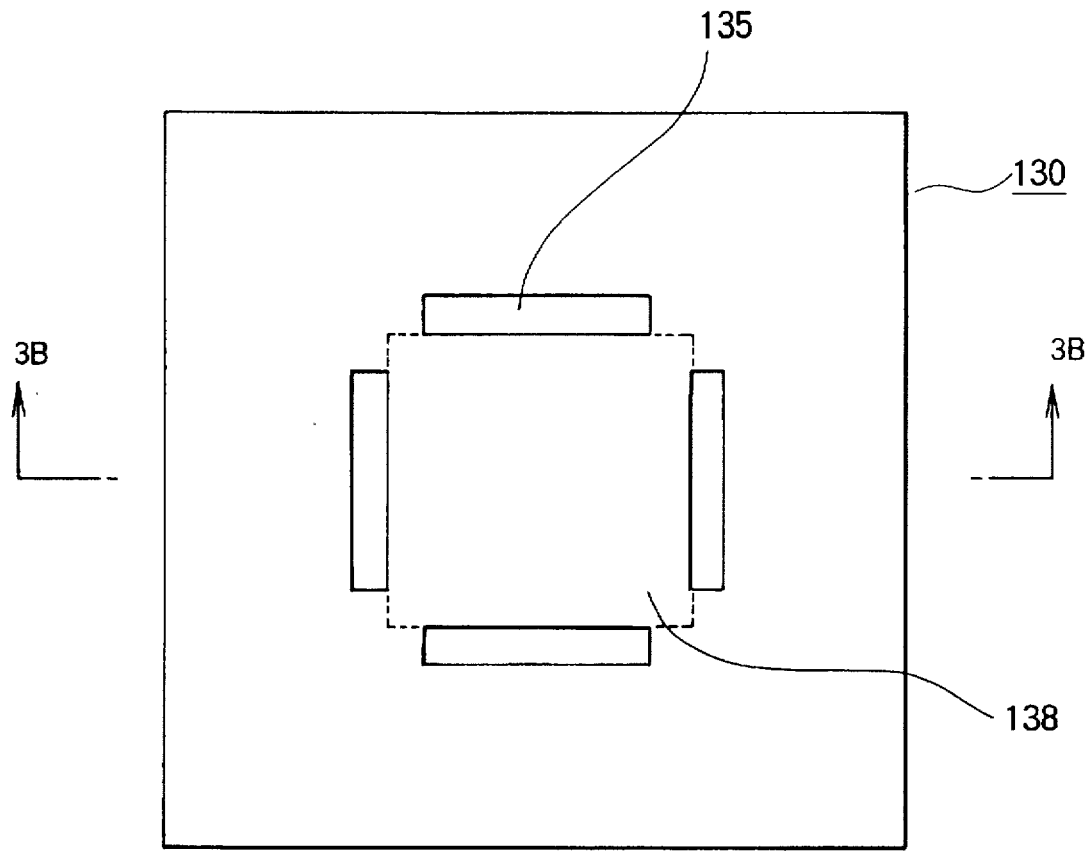
FIG. 3A is a plan view of a carrier film.
Figure 3B:
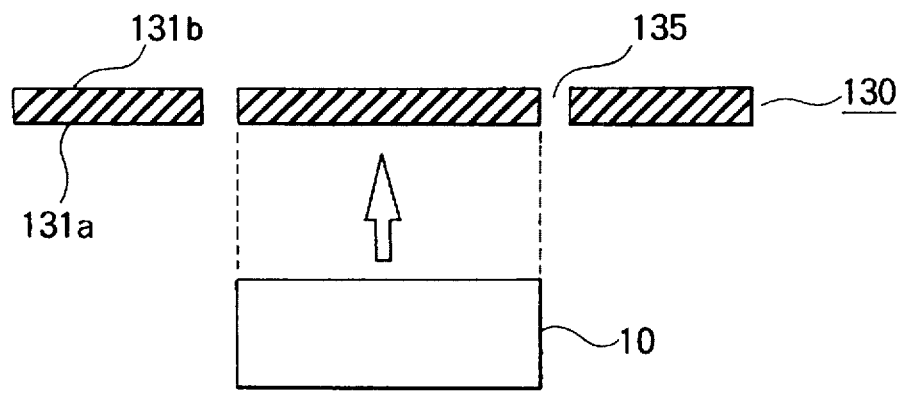
FIG. 3B is a cross-sectional view of a carrier film taken on line 3B—3B of FIG. 3A.

An embodiment of the present invention is now described with reference to FIGS. 3 through 5. A carrier film 130 has slits 135 formed by the periphery of a chip mounting region 138 on which a semiconductor chip 10 is to be mounted. In the illustrated embodiment, the chip mounting region 138 is rectangular as indicated by the dotted line in FIG. 3A. The semiconductor chip 10 is mounted on this chip mounting region 138 on the side of a first surface 131a of the carrier film 130. Though the carrier film 130 is illustrated schematically for the purpose of simplifying the figure, it is understood that this carrier film 130 also comprises similar components such as the interconnection layer to those described above in conjunction with the conventional carrier film. Four slits 135 are formed along the four sides of the chip mounting region 138. Each of the slits 135 has a width of, for example 0.4 mm and may be made by means of punching with a die or etching. These slits 135 operate to prevent the portion of the carrier film 130 outside the chip mounting region 138 from being affected by thermal expansion of the chip mounting region. More particularly, the chip mounting region 138 is thermally expanded when pressure and heat is applied to the carrier film to adhere it to the semiconductor chip 10. This thermal expansion occurs only within the chip mounting region 138 because the slits 135 serve to absorb the stress generated as a result of the thermal expansion.

Figure 4A:
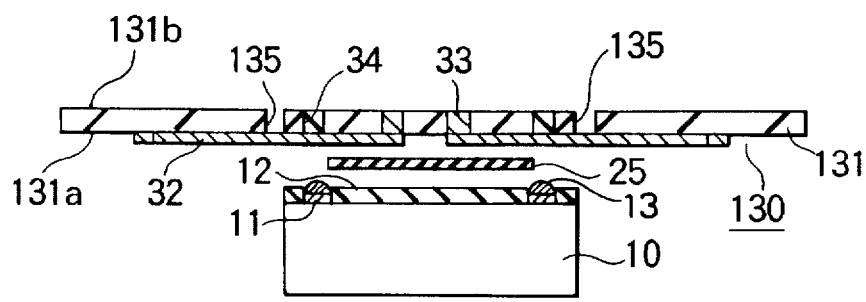
FIGS. 4A through 4G are cross-sectional flow diagrams showing a process for manufacturing a semiconductor device with a carrier film according to the present invention.
Figure 4B:
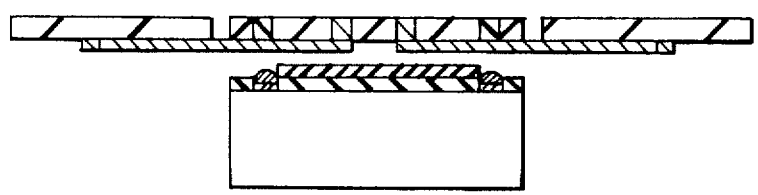
Figure 4C:
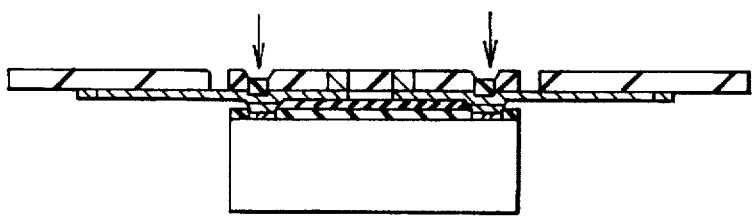

A process for manufacturing a semiconductor device with the carrier film 130 is described with reference to FIGS. 4A through 4G. In this event, description is made on a process for manufacturing a film carrier semiconductor device. Referring to FIG. 4A, a semiconductor bare chip is prepared by using, for example, a well-known wafer manufacturing technique. Ball bumps 13 of gold are formed on the chip electrodes 11. Referring to FIG. 4B, the adhesion film 25 is positioned relative to the semiconductor chip 10 and placed thereon. Referring to FIG. 4C, the carrier film 130 is positioned relative to the semiconductor chip 10 with the adhesion film 25 thereon, and the interconnection layers 32 are connected to the chip electrodes 11 via the ball bumps 13 by means of the inner lead bonding technique. In this event, the aluminum forming the chip electrode 11 is reacted with copper forming the interconnection layer 32 and with the gold forming the ball bumps 13 into an aluminum-copper-gold alloy to ensure the interconnection between them.

Figure 4D:
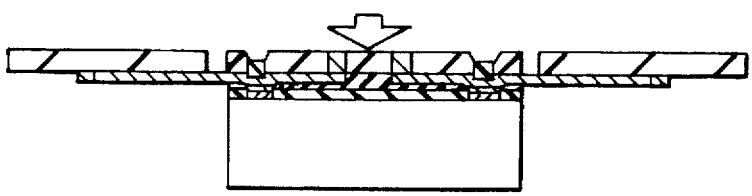

Referring to FIG. 4D, the combination of the semiconductor chip 10 and the carrier film 130 is subjected to heat and pressure to adhere them through the adhesion film 25. The combination, which is referred hereinafter to as a chip assembly, is heated and pressurized for several seconds from the side of either the semiconductor chip 10 or the carrier film 130. Upon the application of heat, the carrier film 30 of the conventional process is warped as indicated by the dotted line in FIG. ID due to the thermal expansion of the film. On the contrary, the thermal expansion occurred in the chip mounting region does not affect the remaining portion of the carrier film 130, reducing the warping of the film. Bump electrodes (solder bumps) 37 are formed on corresponding outer chip electrodes 11 arranged as an array on the carrier film 1there the second surface 131b thereof.

The above mentioned steps illustrated in FIGS. 4B through 4D are not the limit of on the methods available for connecting the carrier film 130 and the semiconductor chip 10. The adhesion film 25 may be positioned and plated relative to the carrier film 130 rather than the semiconductor chip 10. Alternatively, the inner lead bonding may be performed after the carrier film 130 is adhered to the semiconductor chip 10 with high accuracy with the adhesion film 25 interposed between them.

Figure 4E:
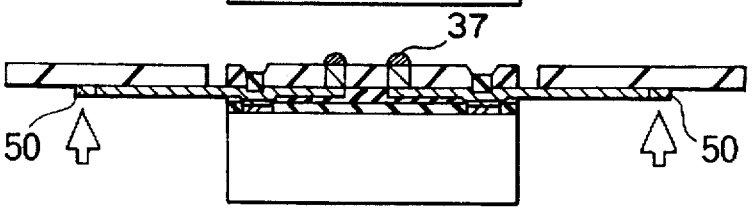

In FIG. 4E, the chip assembly is subjected to an electrical sorting operation and tests on the long-term reliability under low electric field bias temperature (BT) by using a sorting pad 50 in the same manner as in typical tape carrier packages (TCP). The outer configuration and dimensions of the carrier film 130 are designed to meet the specifications determined by Electronic Industries Association of Japan (EIAJ). Such a design allows common use of sorting tools such as sockets and balls for various semiconductor devices.

Figure 4F:
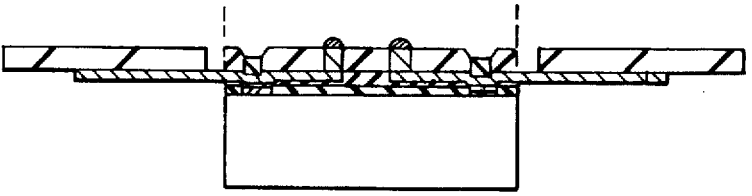
Figure 4G:
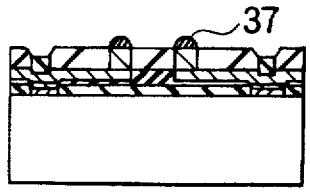

In FIG. 4F, product names are labelled on the back surface of the chip by using a laser beam. In FIG. 4G, the carrier film 130 is then cut along the slits 135. The carrier film semiconductor device is thus completed. The carrier film 130 is not stripped off the chip, which otherwise is caused due to the warping of the carrier film with the result of the poor conductivity of the chip.

Another process for manufacturing a semiconductor device with a carrier film 140 is described with reference to FIGS. 5A through 5G.

Figure 5A:
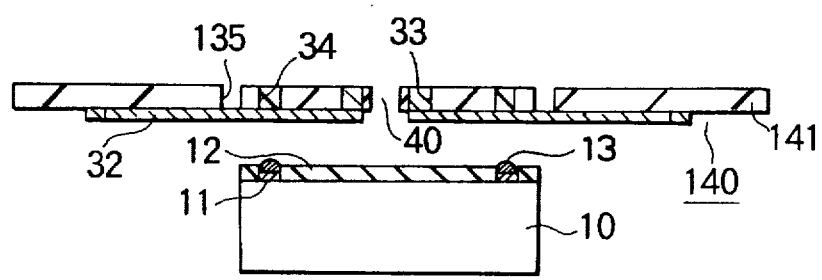
FIGS. 5A through 5G are cross-sectional flow diagrams showing another process for manufacturing a semiconductor device with a carrier film according to the present invention.
Figure 5B:
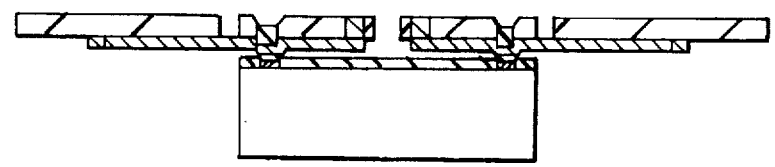
Figure 5C:
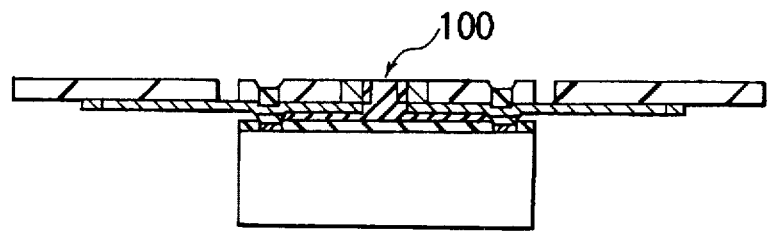
Figure 6:
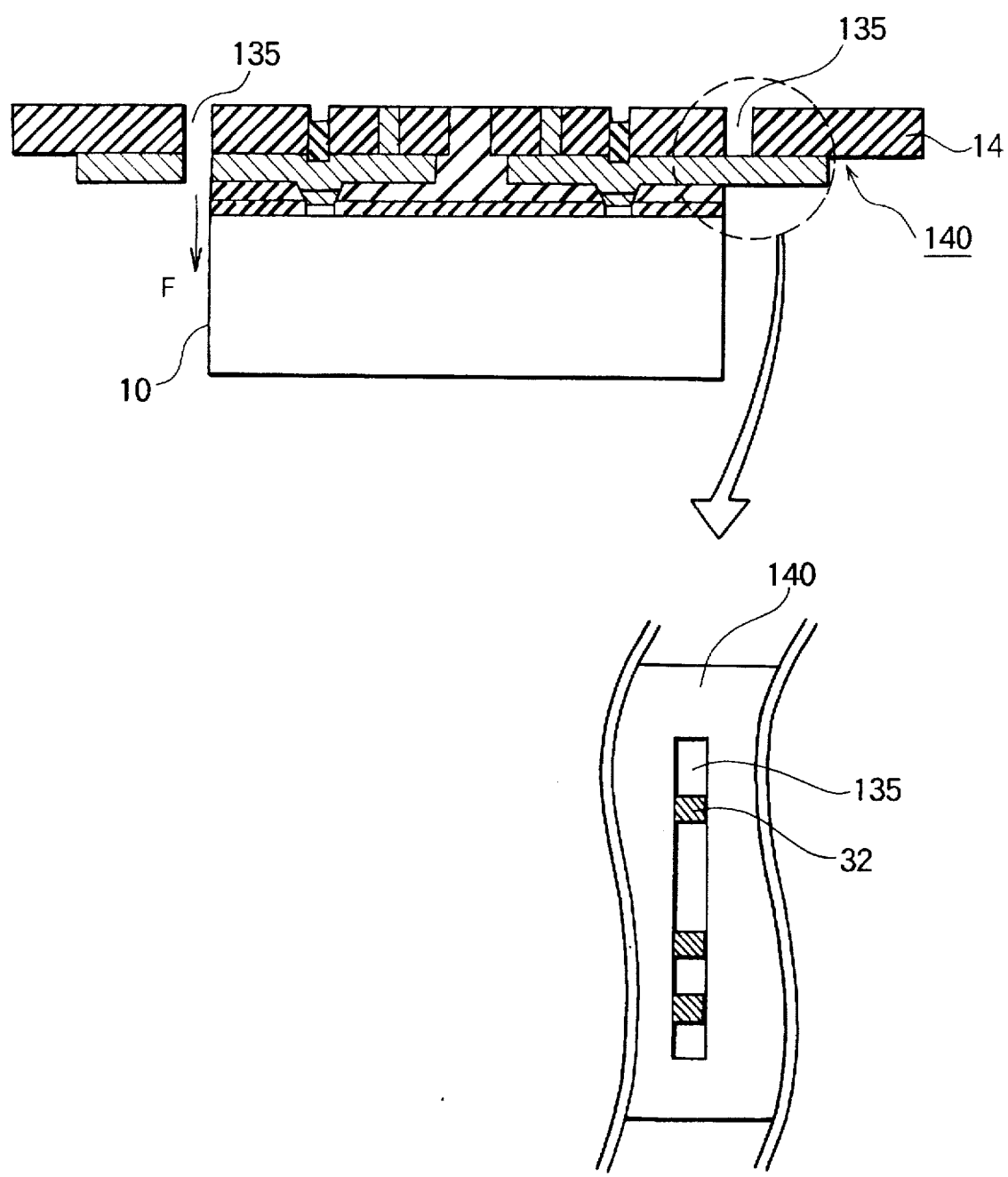
FIG. 6 is similar to FIG. 3B, illustrating a cross-sectional view of a carrier film according to an second embodiment of the present invention for use in describing how to control or adjust the amount of resin left on the side surface of the semiconductor chip.

As illustrated in FIG. 5A, a liquid resin pouring hole 40 is formed in a carrier film 140 on which the interconnection layer 32 is formed as in the conventional method described in conjunction with FIGS. 2A through 2G. Referring to FIG. 5B, the carrier film 140 is positioned relative to the semiconductor chip 10 with the adhesion film 25 thereon, and the interconnection layers 32 are connected to the chip electrodes 11 via the ball bumps 13 by means of the inner lead bonding technique. Then, referring to FIG. 5C, a liquid resin 100 is poured into the resin pouring hole 40 for adhering the semiconductor chip 10 to the carrier film 140. In this event, the liquid resin 100 is caused to flow along the side wall of the semiconductor chip 10 as indicated by an arrow F in FIG. 6 without being left on the side surfaces of the semiconductor chip 10. Though the slit 135 on the right hand of FIG. 6 (encircled with a dotted line) is illustrated as if it is closed with the interconnection layer 32, the interconnection layers are just across the slit 135 and an enough space is left to make the liquid resin fall down along the side of the semiconductor chip. This is clearly shown on the lower portion of FIG. 6. Alternatively, the interconnection layers 32 may be formed only within the chip mounting region 138.

Figure 5D:
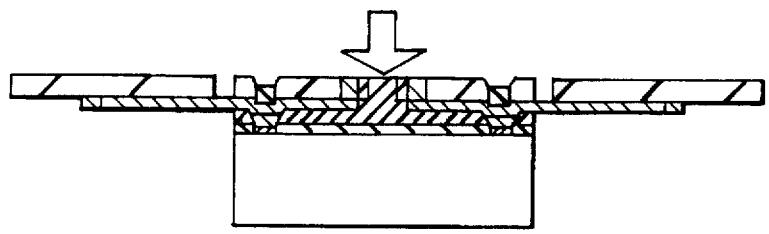
Figure 5E:
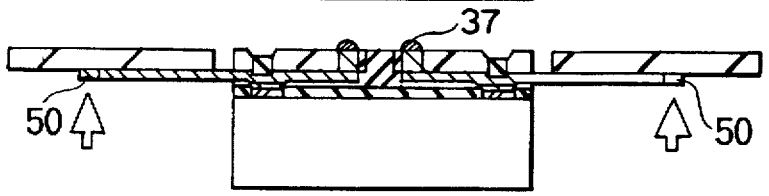
Figure 5F:
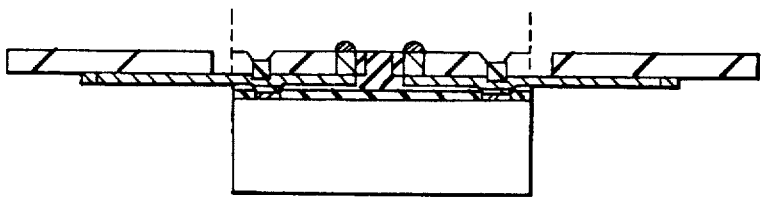
Figure 5G:
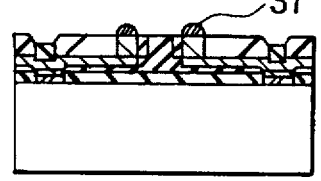

Referring to FIG. 5D, the carrier film 140 is smoothened to provide a wrinkle-free flat surface and is then cured through an adequate manner. Bump electrodes (solder bumps) 37 are formed on corresponding outer chip electrodes 11. The bump electrodes 37 are formed on the surfaces of the semiconductor device corresponding to the chip electrodes 11 on the chip. Next, as shown in FIG. 5E, the semiconductor chip assembly is subjected to an electrical sorting operation and tests on the long-term reliability under low electric field bias temperature (BT) by using a sorting pad 50 in the same manner as in typical tape carrier packages (TCP). In FIG. 5F, product names are labelled on the back surface of the chip by using a laser beam. Referring to FIG. 5G, the carrier film 140 is then cut along the slits 135. In this event, the resin 100 on the sides of the chip is left there without being removed from the surface.

While the slits 135 of the above mentioned embodiments are formed along the periphery of the chip mounting region 138, it may be slightly away from the chip mounting region. Such modification of the position of the slits permits to control or adjustment of the amount of the liquid resin 100 to be left on the sides of the chip 10.

Figure 7:
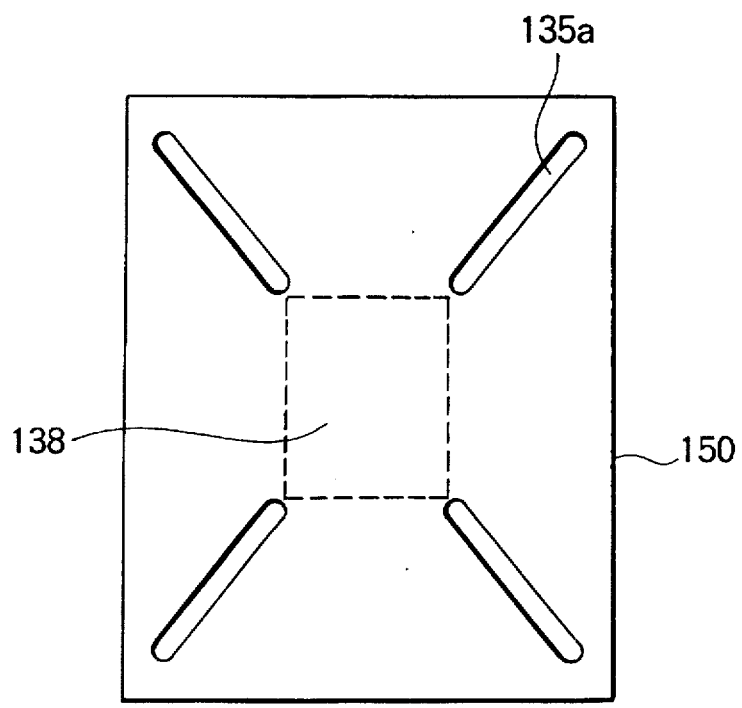
FIG. 7 is a plan view of a modified carrier film of the resent invention.

While the present invention has thus been described in conjunction with a specific embodiment thereof, it is understood that the present invention is not limited to the illustrated embodiment. Instead, any changes, modifications, and variations may be made by those skilled in the art without departing from the scope and spirit of the appended claims. For example, the slits 135 may be formed in the carrier film with being extended radially from the corners of the chip mounting region as illustrated in FIG. 7. The illustrated slits each have a width of, for example 0.4 mm and are semicircular with a radius of 0.2 mm at both ends thereof. The position, dimension, and shape of the slits are not limited to the above mentioned illustrative embodiments. Instead, the slits may be formed in the carrier film at a plurality of positions. However, it is preferable that the slits are formed symmetrically relative to the chip mounting region to effectively reduce the warping of the carrier film.

What is claimed is:

1. A carrier film for use in manufacturing a carrier film semiconductor device comprising a semiconductor chip to which said carrier film is adhered, said carrier film comprising:

a chip mounting region on which the semiconductor chip is to be adhered, said chip mounting region having a flat surface having a length and width substantially equal to the length and width of the semiconductor chip;

slit means for absorbing a stress generated as a result of a thermal expansion during a heat process of adhering the semiconductor chip to the chip mounting region of the carrier film, and for preventing a stripping of said carrier film off of the semiconductor chip during a cutting process of cutting the carrier film to the periphery of the chip mounting region and to the semiconductor chip, wherein said slit means for absorbing a stress and for preventing a stripping comprises a plurality of slits formed in the carrier film, said slits having an inner boundary substantially incident to the periphery of the chip mounting region and an outer boundary outside of said periphery.

2. A carrier film according to claim 1, wherein the chip mounting region is rectangular, and said plurality of slits include four slits formed along the four sides of the chip mounting region such that one edge of each slit is substantially coincident with a corresponding one of said four sides.

3. A carrier film according to claim 1, wherein the chip mounting region is rectangular, and said plurality of slits include four slits, each of said slits having a longitudinal axis extending radially outwardly from a geometric center of said chip mounting region and through a corresponding one of the four periphery corners of the chip mounting region.

* * * * *